United States Patent [19]
Majumdar et al.

[11] Patent Number: 5,831,181
[45] Date of Patent: Nov. 3, 1998

[54] AUTOMATED TOOL FOR PRECISION MACHINING AND IMAGING

[75] Inventors: Arun Majumdar; Mohammed Dahleh, both of Goleta; James Samir Ismail, Santa Barbara, all of Calif.

[73] Assignee: The Regents of the University of California, Oakland, Calif.

[21] Appl. No.: 536,419

[22] Filed: Sep. 29, 1995

[51] Int. Cl.$^6$ .............................. B26D 3/08; G01B 7/34
[52] U.S. Cl. ............................... 73/863; 73/105; 83/919
[58] Field of Search .................................. 83/73, 919, 13; 73/863, 864.41, 105; 250/306, 307; 451/6

[56] References Cited

U.S. PATENT DOCUMENTS

| | | | |
|---|---|---|---|
| 4,147,090 | 4/1979 | Winter et al. | 409/338 |
| 4,896,044 | 1/1990 | Li et al. | 250/492.3 |
| 5,021,672 | 6/1991 | Parkinson | 250/492.2 |
| 5,038,322 | 8/1991 | Van Loenen | 250/306 X |
| 5,047,649 | 9/1991 | Hodgson et al. | 250/306 X |
| 5,138,174 | 8/1992 | Tang | 253/492.3 |
| 5,193,383 | 3/1993 | Burnham et al. | 73/105 |
| 5,210,425 | 5/1993 | Delawski et al. | 250/307 X |
| 5,227,626 | 7/1993 | Okada et al. | 250/307 X |
| 5,252,835 | 10/1993 | Lieber et al. | 250/492.1 |
| 5,260,577 | 11/1993 | Abraham et al. | 250/306 X |
| 5,286,977 | 2/1994 | Yokoyama et al. | 73/105 X |
| 5,304,535 | 4/1994 | Harmer et al. | 505/410 |
| 5,323,376 | 6/1994 | Eigler | 250/306 X |
| 5,327,625 | 7/1994 | Clark, Jr. et al. | 29/25.01 |
| 5,343,042 | 8/1994 | Fuchs et al. | 250/307 |
| 5,359,199 | 10/1994 | Fuchs et al. | 250/307 X |
| 5,461,907 | 10/1995 | Tench et al. | 73/105 |

OTHER PUBLICATIONS

Blackman, G. S., et al., "Atomic force microscope studies of lubricant films on solid surfaces", *Vacuum*, 41: pp. 1283–1286 (1990).

Dagata, J. A., et al., "Modification of hydrogen–passivated silicon by a scanning tunneling microscope operating in air", *Appl. Phys. Lett.,* 56(20):14 May 1990 pp. 2001–2007.

Delawski, E., et al., "Layer–by–Layer Etching of Two–Dimensional Metal Chalcogenides with the Atomic Force Microscope", *J. Am. Chem. Soc.,* vol. 114, No. 5, 1992 pp. 1661–1667.

Dobisz, E. A., et al., "Sub–30 nm lithography in a negative electron beam resist with a vacuum scanning tunneling microscope", *Appl. Phys. Lett.*, 58(22): Jun. 1991 pp. 2526–2528.

Dujardin, G., et al., "Dissociation of Individual Molecules with Electrons from the Tip of a Scanning Tunneling Microscope", *Science,* 255 pp. 1232–1235 Mar. 6, 1992.

Eigler, D. M., et al., "An atomic switch realized with the scanning tunnelling microscope", *Nature,* 352: pp. 600–603 Aug. 15, 1991.

Garfunkel, E., et al., Scanning Tunnelinug Microscopy and Nanolithography on a Conducting Oxide, $Rb_{0.3}MoO_3$, *Science,* 246: pp. 99–100 Oct. 6, 1989.

Kim, Y., et al., "Characterization of nanometer scale wear and oxidation of transition metal dichalcogenide lubricants by atomic force microscopy", *Appl. Phys. Lett.,* 59(26): pp. 3404–3406 Dec. 23, 1991.

Leung, O. M., et al., "Orientational Ordering of Polymers by Atomic Force Microscope Tip–Surface Interaction", *Science,* 255: pp. 64–66 Jan. 3, 1992.

(List continued on next page.)

*Primary Examiner*—Thomas P. Noland
*Attorney, Agent, or Firm*—Fulbright & Jaworski

[57] ABSTRACT

A modified Atomic Force Microscope (AFM), which can machine and image the surface of a sample with nanometer precision in all three orthogonal directions by varying the depth-of-cut of the sample. A multi-repetitive sensor system is provided as is a radially halved quartered electrode to substantially maintain parallelism or substantial parallelism.

16 Claims, 11 Drawing Sheets

OTHER PUBLICATIONS

Lyo, I–W, et al., Field–Induced Nanometer–to Atomic–Scale Manipulation of Silicon Surfaces with the STM, *Science,* 253: pp. 173–176 Jul. 12, 1991.

Mamin, H. J., et al., "Gold depositon from a scanning tunneling miccroscope tip", *J. Vac., Sci. Technol.,* 9(2): pp. 1398–1402 Mar./Apr. 1991.

Weisenhorn, A. L., et al., "Imaging and Manipulating Molecules on a Zeolite Surface with an Atomic Force Microscope", *Science,* 247: pp. 1330–1333 Mar. 1990.

Weisenhorn, A. L., et al., "Immobilized proteins in buffer imaged at molecular resolution by atomic force microscopy", *Biophysical Journal,* 58: pp. 1251–1258 Nov. 1990.

Whitman, L. J., et al., "Manipulation of Adsorbed Atoms and Creation of New Structures on Room–Temperature Surface with a Scanning Tunneling Microscope", *Science,* 251: pp. 1200–1210 Mar. 8, 1991.

Wise, K. D., et al., "Microfabrication Techniques for Integrated Sensors and Microsystems", *Science,* 254 pp. 1335–1342 Nov. 29, 1991.

Griffith, J. E., et al., "A scanning tunneling microscope with a capacitance–based position monitor", *J. Vac. Technol.,* B8:2023–2027 (1990).

Tamer, N., et al., "Feedback Control of Piezoelectric Tube Scanners", Proceedings of the 33rd Conference on Decision and Control, Lake Buena Vista, FL, pp. 1826–1831 Dec. 1994.

AUTOMATED TOOL FOR PRECISION MACHINING AND IMAGING

This invention was made with Government support under Grant No. CTS 9257536 awarded by the National Science Foundation. The Government has certain rights in this invention.

TECHNICAL FIELD OF THE INVENTION

The present invention is in the field of precision machining. In particular, the present invention utilizes a modified atomic force microscope for precision machining and imaging.

BACKGROUND OF THE INVENTION

Scanning probe microscopy began in the early 1980's when Gerd Binning, Heinrich Rohrer, et al. invented the scanning tunneling microscope (STM), capable of resolving surface features at the atomic level {Binning, G., et al., *Phys. Rev. Lett.*, 49:57 (1982)}. The STM operates by moving an extremely sharp tip over a conducting sample at a distance small enough to permit tunneling of electrons. The inability of the STM to image non-conducting surfaces prompted Binning, Quate, and Gerber {Binning, G., et al., *Phys. Rev. Lett.*, 56(9):930 (1986)} to invent the atomic force microscope (AFM) in 1986.

The AFM is a recent invention which has so far been used to image surfaces with atomic scale lateral and vertical resolution. It scans a sharp stylus probe across a sample surface while maintaining a constant contact force between the probe tip and the sample surface through a feedback control system. Conventionally, the AFM is used for imaging surfaces with nanometer and atomic scale spatial resolution. When the sample is moved close to the tip, tip-sample interatomic forces cause the cantilever to deflect. A laser beam is reflected off the back of the cantilever onto a split photodetector to establish an optical lever system. Since the force between two atoms is typically in the 1 pN to 1 nN range, a combination of deflection resolution of 0.01 nm and cantilever spring constant of 0.1N/m is required. The photodetector signal that corresponds to the cantilever deflection or tip-sample force, is used for feedback to control the z-piezo motion so as to maintain a constant tip-sample force. The sample is scanned laterally under this constant force. This mode of operation is called height mode imaging. The z-piezo motion as a function of lateral location can be plotted to give a topographical image of the surface. Single atom contact ensures atomic resolution during surface imaging.

Since its invention, there have been constant refinements in AFM technology. In all cases, however, the following basic requirements must be met {Rugar, D., et al., *Physics Today*, 43(10):23–30 (1990)}:

1. A sharp tip must be kept in close proximity to the sample surface, typically within 50 Angstroms. It is also quite common that AFMs are operated with the tip actually in contact with the sample surface.
2. The tip-sample gap, or interaction force (for contact mode AFMs), must be measured.
3. A scanning system must move the tip or sample in a raster or vector pattern.
4. A feedback system must control the tip-sample gap or interaction force.
5. A display system must convert measured data into an image.

The AFM can also be used in what is called the deflection mode operation. Here the force feedback is cut off and the tip is scanned at a constant level. Cantilever deflections resulting from surfaces are then recorded to obtain a height profile. This mode is the same as that used in traditional stylus profilometers.

In contrast with the contact-mode imaging, which includes height mode and deflection mode, it was found that less sample distortion and higher resolutions can be achieved in the so-called tapping mode. In this mode, the cantilever is mounted on a piezoelectric actuator and vibrated at its resonant frequency. When the tip is brought into proximity of the sample surface, the tip-sample interatomic force changes the resonant frequency, vibration amplitude and the Q-factor {Ducker, W. A., et al., *J. of Applied Physics*, 67(9):4045 (1990)}. Changes in any of these quantities can be used as a feedback signal for controlling the z-piezo motion.

Machining Using the AFM

If the tip is harder than the sample, the AFM can be used to maintain a constant tip-sample force while the tip ploughs through the sample. Initial studies by Kim and Lieber {Kim, Y., et al., *Science*, 275:375 (1992)} as well as Jung, et al. {Jung, T. A., et al., *Technology of Proximal Probe Lithography*, pp. 234–267 (1993)} have shown that patterns can be made with line widths as small as 10–20 nm and depths a low as 2–5 nm. Indentation experiments by the AFM have also been used to measure mechanical properties of ultra-thin films on surfaces.

In addition, a paper given by Dr. Majumdar at the Nov. 15–19, 1993 American Vacuum Society conference in Orlando, Fla. entitled "Nanomechanics of Brittle Material Abrasion Studied by Atomic Force Microscopy", described the investigation of the abrasion of brittle materials on a nanometer scale using an AFM fitted with a single-crystal diamond probe. The paper indicated that the nanomechanics of abrasion have relevance for many common surface machining processes such as grinding, polishing, diamond turning, which are applied to hard and brittle materials.

Lieber, et al, U.S. Pat. No. 5,252,835 discloses a method for machining complex patterns in a metal oxide film using an AFM. As stated in its column 2, lines 34–36, increasing the applied force can result in machining in a controlled manner. The material that Lieber, et al. used, molybdenum oxide, is very soft in one direction so that the force they used, about $5 \times 10^{-8}$N, was sufficient to cut through such material.

Delawski, et al {*JACS*, 114:1661 (1992)} describes the use of an AFM to etch off individual layers from the surface of two-dimensional metal dichalcogenide crystals. The rate of etching is described as being proportional to the force on the tip. Kim, et al. {*Appl. Phys. Lett.*, 59(26):3404 (1991)} describe the use of an AFM to characterize the wear and oxidation of transition metal dichalcogenide surfaces. Leung, et al {*Science*, 255:64 (1992)} describe the deformation of a polystyrene film by an AFM tip. Blackman, et al. {*Vacuum*, 41:1283 (1990)} describe the use of an AFM in wear experiments on multi-layers of cadmium arachidate. The silicon dioxide substrate layer was not removed under the loads used in those experiments (less than $2 \times 10^{-7}$N).

Delawski, et al., U.S. Pat. No. 5,210,425 discloses a process for etching with an AFM, using a two-dimensional metal chalcogenide as the substrate. The forces used are described as $10^{-12}$ to $10^{-6}$N.† This range encompasses the force contemplated by Dr. Majumdar of $1 \times 10^{-8}$N. The patent (in its column 1, lines 56–66) makes reference to other disclosures of writing using an AFM wherein the microscope tip physically touches, scratches, indents, or creates holes in the substrate surface, with high forces. The articles by Weisenhorn, et al. {*Sci.* 247:1330 (1990); *Biophy. J.*, 58:1252 (1990)} referred to in this patent disclose maintaining the cantilever tip at a constant vertical position via a feedback loop, to rearrange or remove chemical compounds from the surface of the sample.

†Reference at column 2, lines 43 to $10^{12}$ to $10^{-6}$N is obviously a mistake, as shown at column 5, line 1.

Burnham, et al, U.S. Pat. No. 5,193,383 uses an AFM for indentation as well as measurement, the purpose of which is to measure surface and mechanical properties. There is no suggestion to use it as a cutting tool. Penetration is determined by an STM associated with the rear end of the AFM tip. The cantilever beam for the AFM is made up of small diameter tungsten wire, but the stiffness is not given. However, the reference does state that the effective spring constant of the cantilever beam may be altered by changing the length of the wire (column 3, lines 63–65).

Fuchs, et al., U.S. Pat. No. 5,343,042 describes the use of a STM or an AFM to modify the structure of a surface, but wherein such surface is not disturbed or destroyed, even locally at the site of modification (column 4, lines 63–65). The patent is concerned more with the application of a tunneling voltage to accomplish its task. The reference is only relevant in that it states that the structure can be imaged before and after modification has taken place.

Okada, et al., U.S. Pat. No. 5,227,626 describes the use of a plurality of STM cantilevers.

Clark, Jr., et al., U.S. Pat. No. 5,327,625 discloses the use of a scribe for forming nanometric features in which a support is moved in the x-y-z directions by primary control motors. An atomic force probe detects surface features of the sample.

Fuchs, et al, U.S. Pat. No. 5,359,199 describes the use of an STM, but also mentions an AFM, in conjunction with modification of a surface in order to store information, but without destroying the atomic order of the surface at the location of the structure or in its vicinity.

Bifano used an AFM having a probe made of a sharp diamond tip mounted on an aluminum foil cantilever {Bifano, T.G., "Ductile-Regime Grinding of Brittle Materials, PhD Thesis, North Carolina State University (1988)}. Controlled forces in the nanoNewton (nN) and microNewton ($\mu$N) range allowed machining of single crystal silicon with cutting depths in the range of 3–20 nm and widths in the range of 50–200 nm range. The pressures generated during machining were in the 10 GPa range. It was found that the silicon behaved as a ductile material under this condition, whereas macroscopically it was brittle.

Scanning Speed of the AFM

Current AFM technology suffers from very low scanning speeds. The highest scanning speed achieved by a commercial AFM (Nanoscope III from Digital Instruments, Santa Barbara, Calif.) is 60 Hz per line. In a conventional AFM, the scan speed must be kept well below the limiting natural frequency. Approaching the natural frequency causes higher order modes of the cantilever or tube to be excited which results in spurious scan data. For an image containing 512 lines (the maximum for this instrument), it takes 8.53 seconds for one image. Recently, AFMs have been constructed that produce images at 3 Hz per frame in contact mode {Barrett, R. C., et al., *J. Vac. Sci. Technol. B*, 9(2) :302–306 (1991)}. However this relatively high image rate was not achieved by simply increasing scan rates. The scheme utilized an interlaced scan at about 10:1 ratio in order to enhance the speed of visual feedback to the operator {Barrett, R. C., et al., *J. Vac. Sci. Technol.* B, 9(2):302–306 (1991)}. Because of the increased scan rate and resonance limitation of the piezoelectric tubes, the images had to be taken in constant height mode which causes variable tip-sample interaction forces. As Barrett, et al. pointed out in their paper, this could lead to AFM-induced sample damage. Also, rough surfaces may deflect the cantilever too much causing it to break. This severely limits the sample types that can be surveyed with this microscope.

Diamond Turning

Diamond turning has been used as a key manufacturing process in precision machining. Typically the depth-of-cut is in the 1–50 $\mu$m range whereas the surface finish is in the 0.5–10 nm range depending on the tool sharpness, machining conditions, and material behavior.

SUMMARY OF THE INVENTION

The present invention presents an automated tool for precision machining (e.g., cutting, shaping and surface finishing) and imaging materials using a scanning force device such as a modified Atomic Force Microscope (AFM), preferably with nanometer precision in all three orthogonal directions. The modified AFM can machine and image a sample in its contact and tapping mode, respectively.

The preferred automated tool of the present invention has the following features:

(1) To maintain a uniform depth-of-cut, if the sample to be cut is made of uniform material, the tool-sample distance can be kept at a constant by using a fixed spring constant. However, in the preferred embodiment, the force is varied without keeping the tool-sample distance constant. Here, the automated tool contains a flexible cutting tool, which allows for real time variation, while cutting, of the cantilever stiffness by varying the length of the cantilever and thus the distance or depth-of-cut (z-direction). This is achieved by a feedback control based on simultaneously measuring the tip-to-sample normal force (z-direction), and tip-to-sample frictional or tangential force (x-and y-directions), and utilizing these measurements to control the motion of its tip in the z-direction. This is unlike conventional AFMs which generally only provide feedback control in the z-direction. In the present invention, the force is varied without keeping the tool-sample distance constant. The preferred automated tool of the present invention has closed loop robust control which keeps either the tool-sample force or the tool-sample distance constant. For example, the control can achieve the foregoing by using a constant force mode (height mode) or a constant separation mode (deflection mode). In the constant force mode, the force is preferably maintained in the milliNewton (mN) or nanoNewton (nN) range. The modified AFM has a contact mode cantilever with a stiffness of at least 10N/m (and resonant frequencies 10–100 Khz), such as between 10–1,000N/m. With the increased stiffness, the automated tool can cut materials which cannot be cut by a conventional AFM which has a stiffness of between 0.01 to 1N/m. For example, by increasing the spring constant of the cantilever, cutting depths between 1 and 20 nanometers in a hard material like silicon are achievable. In both the height and deflection modes, preferably, the depth-of-cut is between 1 nm to 10 microns, with surface finishes ranging from 0.1 nm–1 nm, and the normal and tangential forces are between 1 nN to 1 mN. Nanometer-scale vertical and lateral resolutions can be achieved, in the nN to $\mu$N range, with preferably between 10 nN to 1 $\mu$N resolution. More preferably, machining is done with lateral resolution in the 30 nm–10 μm range.

(2) The instant tool can machine a sample in its contact mode and image a sample in its tapping mode. The near-resonance cantilever oscillation can be used to obtain topographical images of surfaces, preferably with spatial and vertical resolutions in the nm range, e.g., the tapping mode can be used to image surfaces, without causing damage, with the same stiff cantilever used for cutting in the contact mode. The workpiece surface is patterned to any desired shape, e.g., rotationally symmetric or non-symmetric.

(3) The instant tool enables rotational and/or translational relative motion between the tool and the sample. The rotational mode is preferably provided by mounting a motor inside the piezoelectric tube actuator of a conventional AFM, which can rotate the sample platform.

(4) The instant tool has a piezoelectric tube that has its end parallel or substantially parallel to its original configuration throughout the scanning motion. That is, throughout the scanning motion, the translational movement of the top of the piezoelectric tube, on which the sample is placed, in the x- and y- planes is achieved without inordinate rotational movement about the x- and y- axes relative to its original configuration. This feature maintains the sample in a horizontal position in relation to the scanning microscope.

All the above listed features make the present invention superior to existing precision machining tools.

Another aspect of the invention presents a piezoelectric tube with radially separated sections with strategically located electrodes which are electrically coupled to allow translational movement of the top of the piezoelectric tube, on which the sample is placed, in the x- and y- planes without rotational movement about the x- and y- axes (as illustrated in FIG. 9D).

Another aspect of the invention presents a sensor, preferably utilizing laser, which is useful, e.g., for sensing the motion of a piezoelectric tube. The sensor may additionally be coupled to a feedback control, which controls the motion of the piezoelectric tube. In the preferred automated tool of the present invention, the feedback control controls the motion of the piezoelectric tube in the x- and y- directions. In the most preferred embodiment, the sensor and control system are used in the above modified AFM to control the motion of the piezoelectric tube in real time. This is an advancement over the current AFM which does not have a sensing mechanism nor a feedback control in the x- and y-axes.

Another aspect of the invention presents the components and method for adjusting the length of the cantilever. These components are preferably coupled to a control system to adjust, in real time, the force between the cantilever tip and the sample surface.

DETAILED DESCRIPTION OF THE INVENTION

Figure 1:
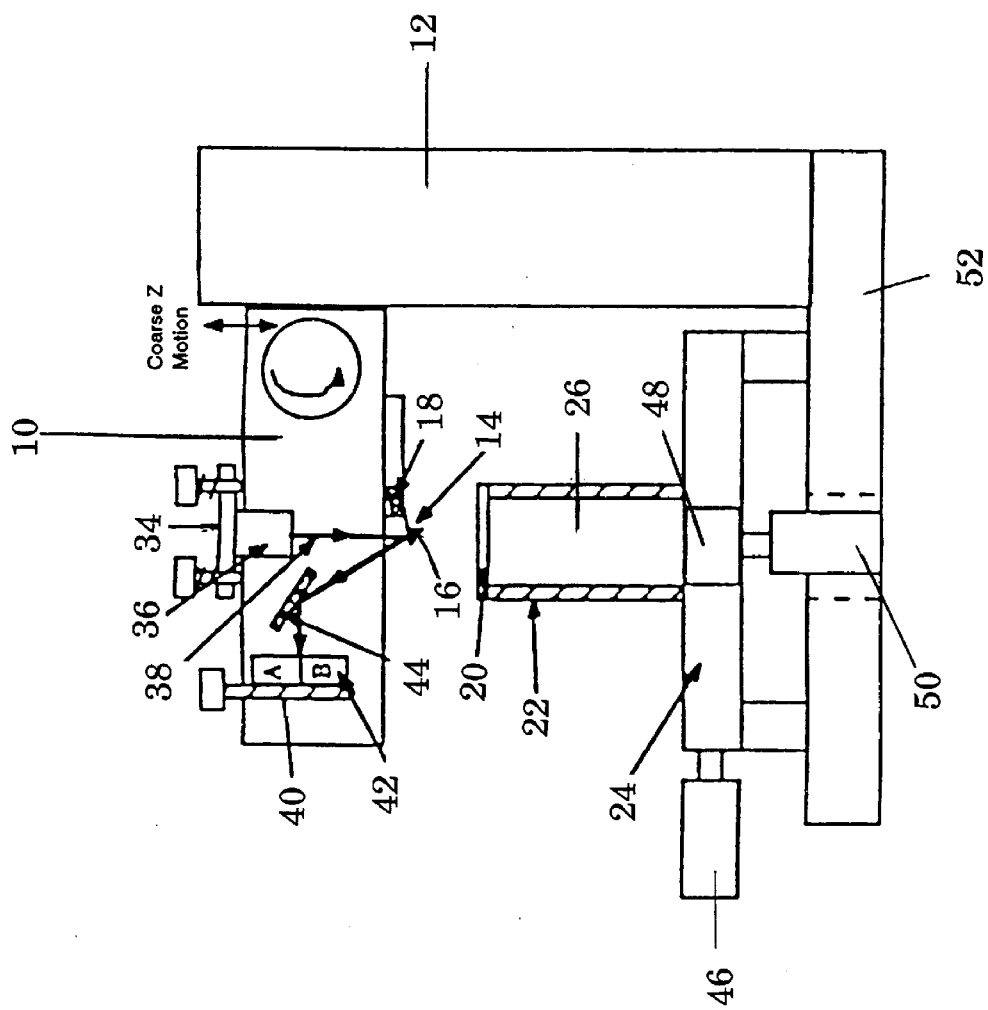
FIG. 1 is a schematic view of one embodiment of the invention.
Figure 2:
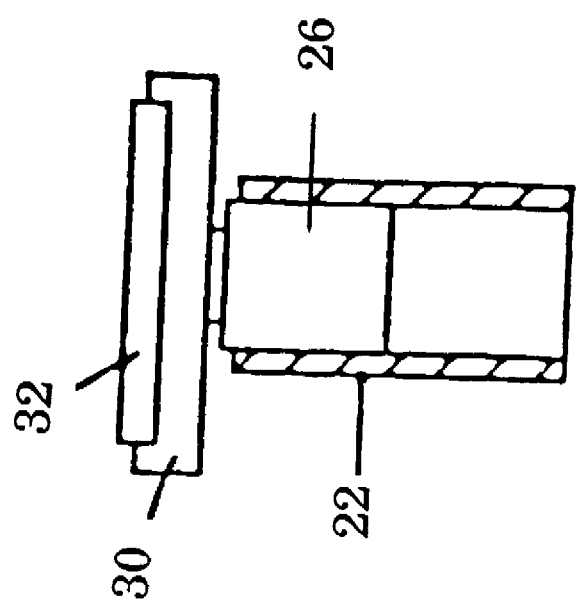
FIG. 2 is a schematic view of a motor which can be inserted inside the piezoelectric tube to provide rotational sample motion.
Figure 3:
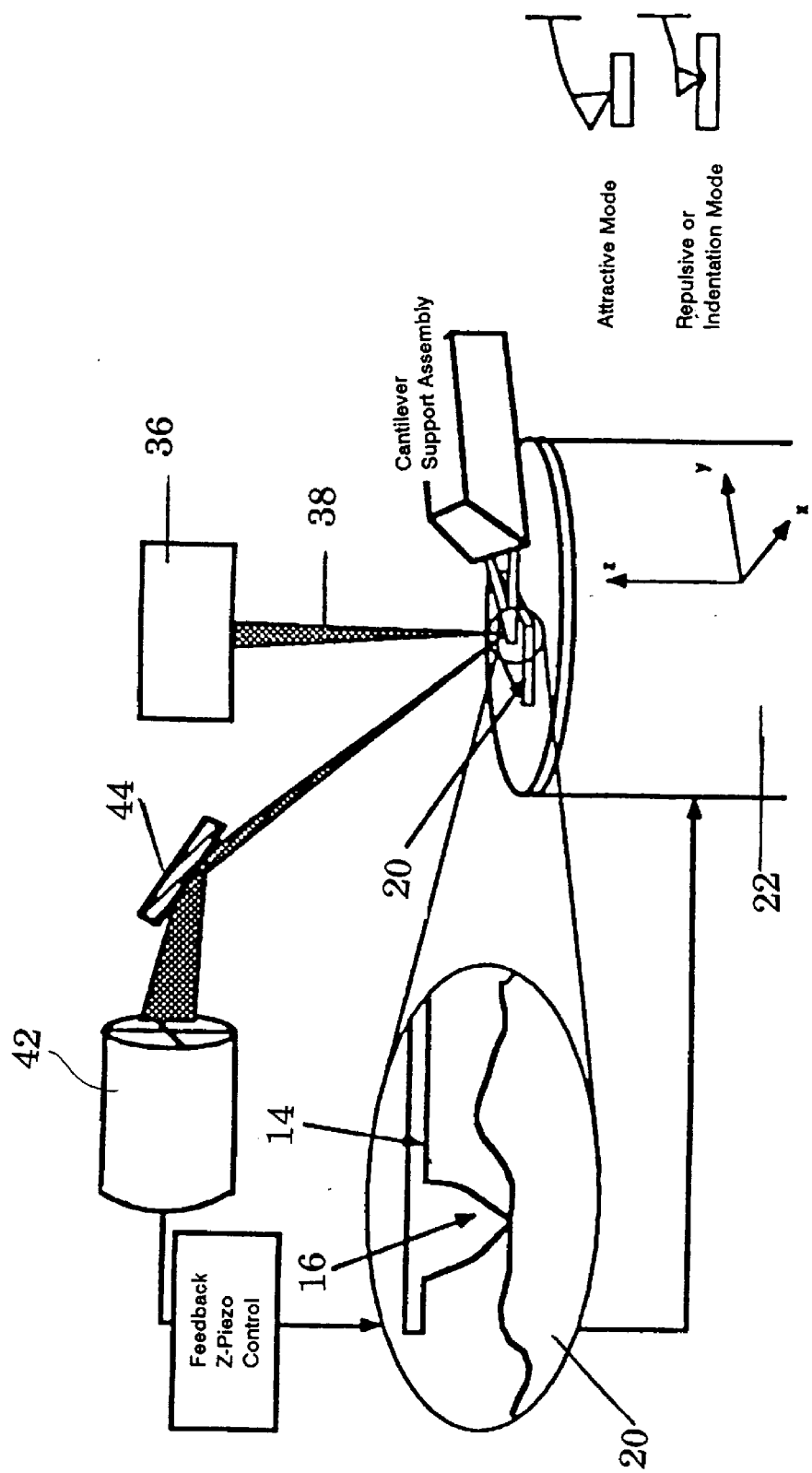
FIG. 3 is a schematic detailed view of the AFM tip sample region.
Figure 4:
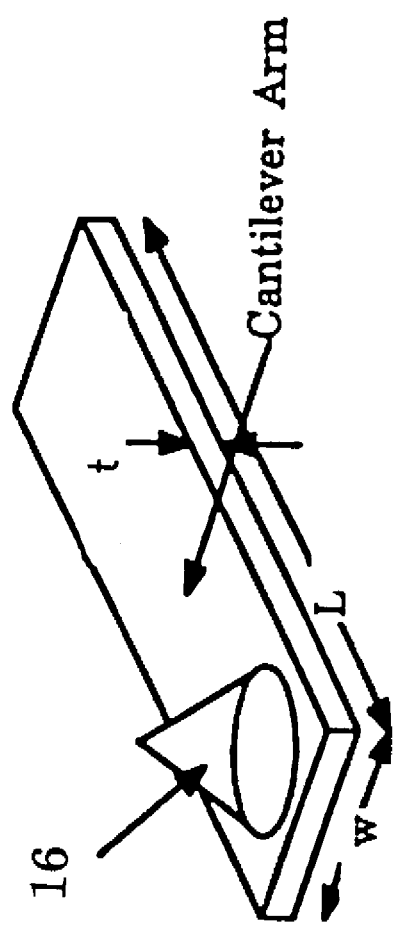
FIG. 4 is a schematic view of a diamond tip used in an embodiment of the invention, wherein "t" denotes thickness, "L" denotes length, "w" denotes width.

Referring to FIG. 1, an automated tool of the present invention can be produced by modifying an AFM by making its cantilever 14 out of a thin foil of aluminum, stainless steel or another suitable metal or mateial, and adjusting the length, width, and thickness to get a spring constant of about 10–1,000N/m. At the end of the cantilever 14, a sharp tip 16, preferably a diamond tip, is attached as shown in FIG. 4. The diamond tip 16 is conical in shape and is sharpened to produce a tip radius of about 0.1 μm or less. As shown in FIG. 4, the diamond tip 16 typically has a radius of less than 1 μm. The typical dimensions, shown in FIG. 4, are t=25 to 300 microns, w=0.1 to 1 mm, and L=1 mm to 5 mm. A sensitivity of 0.1 nm for the optical lever detection system ensured a force sensitivity of 1–10 nN. While maintaining a constant tip-sample force, the piezoelectric actuators 54 are scanned to produce the machining action. As shown in FIG. 1, similar to commercially available AFMs, the head 10 contains the optical system (see also FIG. 3 for a blown up illustration of the optical system) to detect cantilever deflections in the 0.01 nm range. The whole head 10 is mounted on a microscope rail 12 that can be used for hand-adjusted coarse or macroscopic z-motion. The head 10 can be rotated by about 45 degrees to change the cutting rake angle. The cantilever 14 and diamond tip 16 are mounted on a dither piezo 18 for two purposes—fast tool response and tapping mode imaging. For translational motion only, the sample or workpiece 20 is mounted directly on the piezoelectric tube actuator 22. This is then mounted on a motor-driven x-y-z microtranslational stage 24 with resolution of about 1 μm and range of about 1 cm. Capacitive or optical sensors (such as the laser sensors described below) are placed to sense the x and y or lateral motion of these drives as well as that of the piezoelectric tube actuator 22. For rotational motion of the sample 20, a small motor 26 is inserted into the piezoelectric tube 22 to rotate a spindle 30 and sample stage 32 (as shown in FIGS. 1 and 2). The microtranslational stage 24 and the rotational motion by the motor 26 allows sample scans larger than 100 μm, which produces rotationally symmetric surfaces and increases tool-sample relative velocity.

It should be noted that in the present embodiment of the AFM, a force-map F(x,y) can be provided by the user. This force map will give a certain force for every lateral location on the sample. This can be reproduced by the feedback system to obtain the desired shape of a material. However, this may need prior knowledge of the material deformation characteristics. The force-feedback is a good technique of controlling the tool force so that tool wear can be limited or controlled. In addition, a depth-of-cut D (x,y) map can also be provided and used in the distance feedback mode to obtain a desired shape. Therefore, non-rotationally symmetric and other aspheric surfaces can be easily machined. In short, a fully computer controlled cutting operation can be performed with nanoscale lateral and vertical resolutions.

The other details of the AFM, including its components are: laser mount 34, diode laser 36, laser beam 38, photodetector alignment screw 40, photodetector 42, mirror 44, x-Drive 46, y-Drive 48, z-Drive 50, and base plate 52 (see FIG. 1). FIG. 3 presents a detailed illustration of the detection of a laser beam 38 by photodetector 42 after the laser beam 38 is reflected off sample 20 and then deflected by a mirror 44. The detection by a photodetector 42 in turn is used as a feedback z-piezo control to control the motion of the cantilever 14 in the z-direction. The components and their operation as described in this paragraph are well known in the art.

Figure 8:
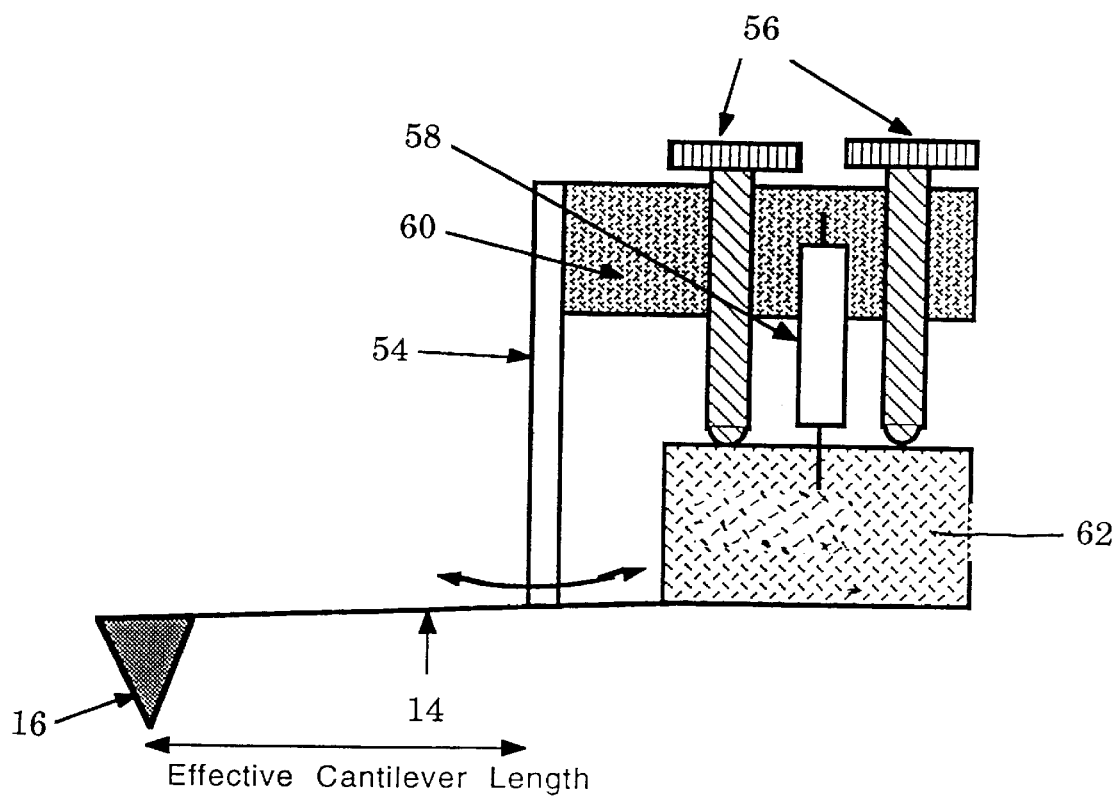
FIG. 8 is a schematic view of the cantilever with the length adjustment for the real time control of cantilever stiffness.

Another aspect of the invention presents the components and method for adjusting the stiffness of the cantilever 14. The effective cantilever length which controls the stiffness of the cantilever 14 can be adjusted in real time by bending a piezoelectric actuator 54 (see FIG. 8). The piezoelectric actuator 54 is connected to the cantilever 14 such that the bending of the piezoelectric actuator 54 causes the lengthening or shortening of the cantilever 14. For example, the piezoelectric actuator 54 is preferably connected at an angle of between about 80° to 100°, and most preferably at a right angle, relative to the cantilever 14, whereby the direction of bending of the piezoelectric actuator 54 at an angle of between about 60° to 120° relative to the cantilever 14 causes the lengthening or shortening of the cantilever 14. The preferred embodiment is shown in FIG. 8. When the piezoelectric actuator 54 bends to the left, the effective length reduces and the cantilever 14 becomes stiffer. When the piezoelectric actuator 54 bends to the right, the effective length increases and the cantilever spring constant is reduced. The adjustment screws 56 can move the piezoelectric actuator 54 up and down and can be used for bringing the piezoelectric actuator 54 in position for this operation. The spring 58 holds the upper block 60 in position with respect to the cantilever substrate 62 so that there is no backlash.

The use of cantilevers with a spring constant of between about 10N/m to 10N/m on a hard material such as silicon (Si) generally limits the depths-of-cut to the 1–20 nm range. Cantilevers with spring constants in the 10–1000N/m range can easily be made which increases the depth-of-cut to those comparable to traditional diamond turning machines, which is between 1 nm to 10 μm.

The main obstacle to achieving high scanning speeds in the prior art AFM lies in the mechanical resonances of the cantilever and piezoelectric actuator. Since the cantilever spring constant for contact-mode image must be about 0.1N/m, the resonant frequencies have been in the 10–100 KHz range. If the maximum bandwidth is 100 KHz and the number of samples per line is 512, the line-scanning frequency is at most 195 Hz. For the maximum scan size of 100 μm, the maximum tip-sample velocity under these conditions is 6 mm/s whereas those relevant to cutting are 1–10 m/s. Since the modified AFM of the present invention uses stiffer cantilevers for machining, the resonant frequency can be raised to about 500–800 KHz. If the piezoelectric tube is controlled 512 times each line, a line-scanning frequency higher than 1 KHz can be achieved. The term "a line" means a circle obtained in a rotational motion or a straight line in a translational motion. If the line length is 1 mm, the tool-sample velocity is 1 m/s and the feedback is invoked every 2 μm.

Besides the cantilever bandwidth, it is also important to increase the bandwidth of the piezoelectric tube actuators. When translational motion is adequate for machining, the sample will be directly placed on the piezoelectric tube. The small mass of the sample will allow the bandwidth to be in the 500 KHz range. For rotational motion the rpm of the motor decides the tool-sample speed. Therefore, it is not necessary to depend on the piezoelectric tube to increase lateral speed. Nevertheless, the z-piezo must be able to respond to changes in sample height so that feedback control can be implemented. Since the mass of the motor will reduce the piezoelectric tube bandwidth, another piezo must be used. In this case, the cantilever 14 will be mounted on a dither piezo 18 as shown in FIG. 1. Since the mass of the cantilever 14 is usually much smaller than that of a motor, the dither piezo 18 can have a bandwidth in the 1 MHz range. Besides inducing fast z-motion control, the dither piezo 18 serves a second purpose. It is used to oscillate the probe at resonant frequency during surface imaging using the tapping mode.

Due to nonlinearities inherent to the piezoelectric tubes such as hysteresis, creep and variable voltage sensitivity {Barrett, R. C., et al., *J. Vac. Sci. Technol.* B, 9(2):302–306 (1991)}, imaging and machining can be replete with distortion. This is because in an AFM, there is no control on the x and y or lateral motion of the piezoelectric tube. Sometimes, a linear relationship between voltage and displacement is assumed but while this assumption is reasonable for small scanning ranges on the order of atomic distances, beyond a few nanometers the effects of increasing sensitivity and hysteresis become significant {Hutter, J., et al., *Rev. Sci. Instrum.,* 64(7):1868–1873 (1993) and van de Leemput, L. E. C., et al., *Rev. Sci. Instrum.,* 62(4):989–992 (1991)}. To overcome these problems, the present invention presents position sensors (such as in FIGS. 10A and 10B and discussed below), e.g., laser sensors, which are used for each lateral motion detection. The sensor is used to measure the x and y motions of the piezoelectric tube or sample. This can be used in a feedback control of x and y sample motion to reduce piezo hysteresis, backlash, and other undesirable motions. This method offers a much simpler and less expensive alternative to interferometers without sacrificing accuracy.

Figure 9A:
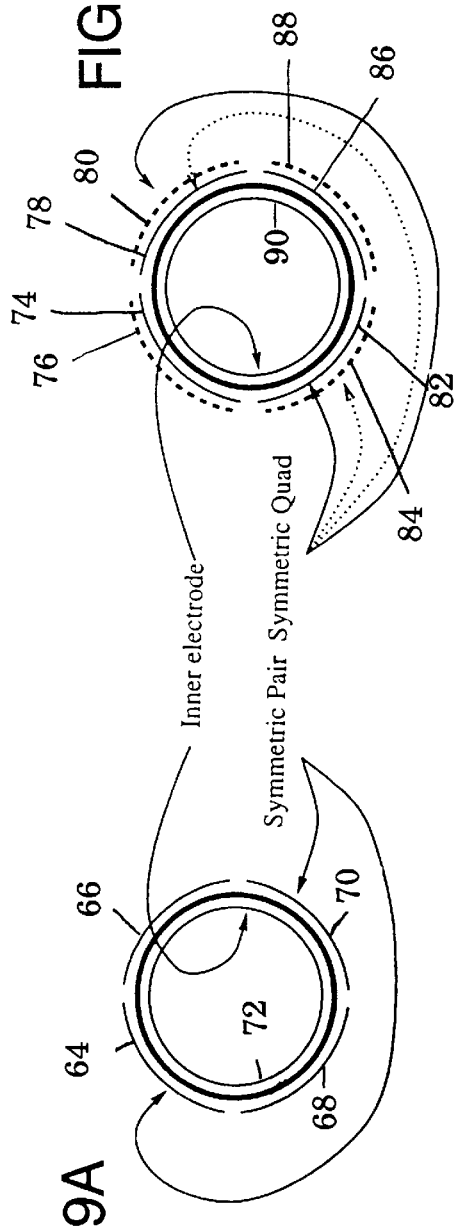
FIGS. 9A and 9B are top and side views of a conventional quartered piezoelectric tube, respectively.
Figure 9B:
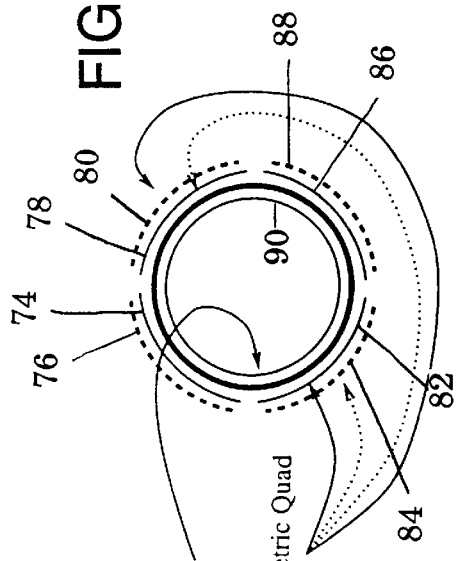

A piezoelectric tube with four symmetric outer electrodes 64, 66, 68 and 70 and one inner electrode 72 (FIG. 9A) has been used as an actuator with nanometer resolution in standard scanning probe microscopes (e.g., scanning tunneling and atomic force microscopes). Actuation can be achieved by applying voltages of equal magnitude and opposite sign to a symmetric pair of outer electrodes 64, 66, 68 and 70 (FIG. 9A) while grounding the inner electrode 72. This causes the top of the tube to translate and rotate through an angle phi relative to its initial configuration (see FIG. 9B). In FIG. 9B, the dotted lines show the tube in its initial configuration, and the solid lines show the tube in its deflected configuration.

Figure 9C:
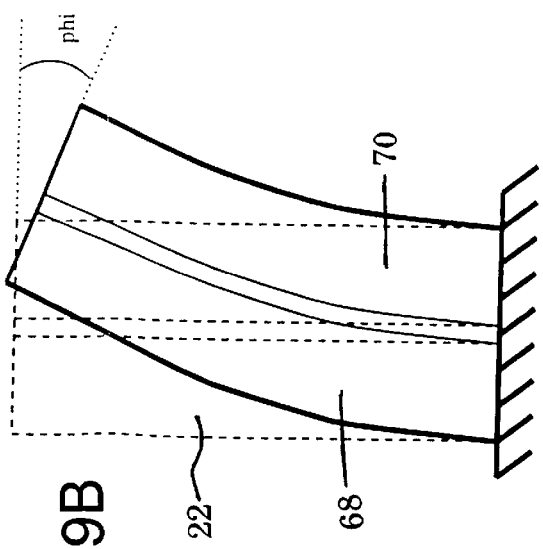
FIGS. 9C and 9D are the respective top and side views of the piezoelectric tube, of the present invention, with quartered and radially halved electrodes.
Figure 9D:
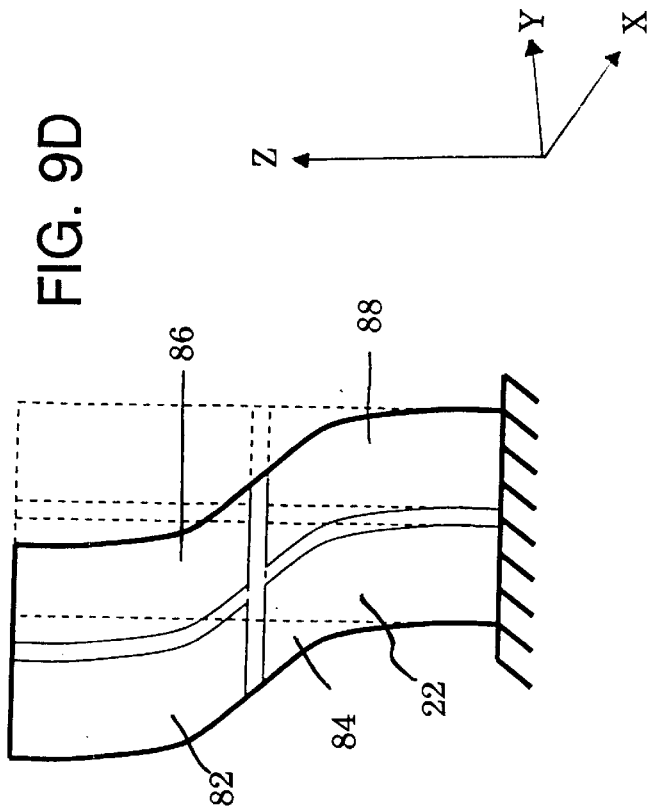

Another aspect of the present invention presents a piezoelectric tube which is also radially halved at equidistance from the top and bottom of the tube, the resulting piezoelectric tube thus has eight symmetric outer electrodes 74, 76, 78, 80, 82, 84, 86 and 88, and an inner electrode 90 (see FIG. 9C). In FIG. 9C, the upper electrodes are denoted by solid lines, while the lower electrodes are denoted by dashed lines. Correctly applying voltages to the outer electrodes 74, 76, 78, 80, 82, 84, 86 and 88, while grounding the inner electrode 90 results in a translation of the top of the tube without a rotation. (See FIG. 9D.) For example, voltages of opposite sign may be applied to a symmetric quad of outer electrodes, while grounding the inner electrodes. The actual voltages to be applied, to achieve translation without rotation, can be determined via a feedback control based on the output of the position sensor, such as the position sensor described below. In FIG. 9D, the dotted lines show the tube in its initial configuration, and the solid lines show the tube in its deflected configuration. The top of the tube remains parallel or substantially parallel to its original configuration throughout the scanning motion. That is, throughout the scanning motion, the translational movement of the top of the piezoelectric tube, on which the sample is placed, in the x-and y- planes is achieved without inordinate rotational movement about the x-and y- axes relative to the piezoelectric tube's original configuration.

If the "halving" of the four electrodes is not equidistant, then the eight electrodes are not symmetric with respect to the halving axis. Again, the translation without rotation can be achieved by correctly choosing the applied voltages as determined via the feedback control which is based on the output of the position sensor, such as the position sensor described below.

The above describes the optimal embodiments of the piezoelectric tube. However, one skilled in the art would realize that he can also divide the piezoelectric tube by a different factor, e.g. a factor of 3 or 4, and determine the appropriate voltages based on the above teaching.

Position sensor for use in closed loop piezo-tube scanning probe microscopy

Another aspect of the invention presents a position sensor based on the optical lever technique. The sensing system can be used to sense the motion or orientation of a surface, e.g., in the x- and y- positions. The system has at least two reflective objects located on two separate points on a surface whose orientation is to be detected. For calibration, the reflective objects are first positioned such that a light beam directed at one of the reflective objects is reflected into the other reflective object, which in turn reflects the light into a light detector. If the surface moves from the first position, the light detector contains means to detect or compute the motion or orientation of the surface based on the movement or deviation of the reflected light from that produced in the first position. The preferred reflective objects are mirrors and the light is a collimated laser beam. This sensor can be used, e.g., in combination with the modified AFM of the present invention which allows the application of feedback control techniques to the modified AFM. Thus, the modified AFM has the means for detecting motion of the top of the piezoelectric tube in the z-, x- and y- axes; this is an advance over the prior art AFM which can only sense the z-motion.

Figures 10A, 10B:
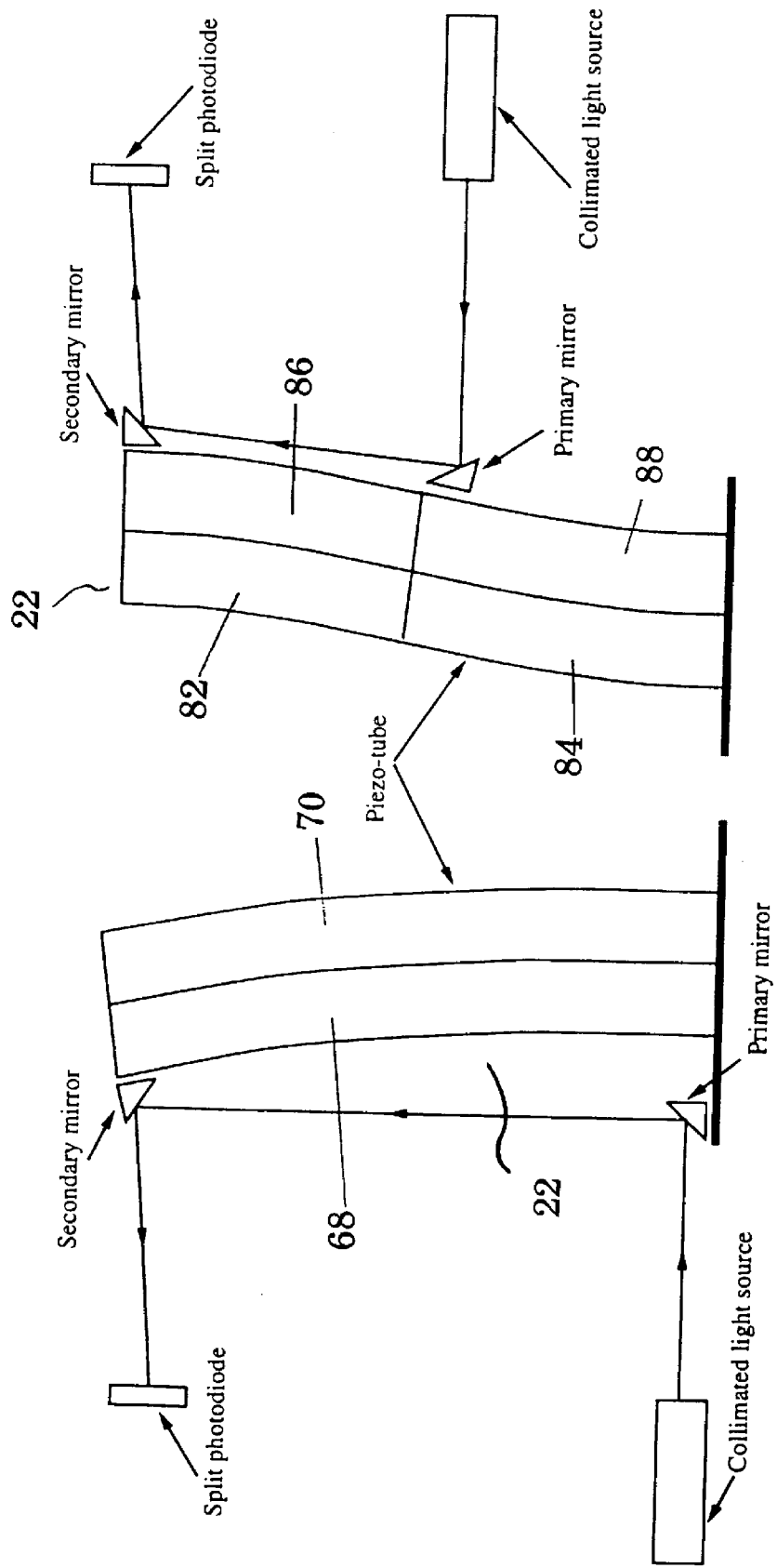
FIGS. 10A and 10B present schematic views of the laser sensor as used to detect lateral (x- and y- directions) movements of a conventional piezoelectric tube and the piezoelectric tube of the present invention, respectively.

The sensor can be used to detect the motions of mechanical parts. For example, the sensor is readily applied to either the conventional or the present invention's piezoelectric tube 22, as shown in FIGS. 10A and 10B. The sensor consists of a collimated light source, a primary and secondary mirror and a split photodiode. In the first case, the primary mirror is fixed relative to the tube and reflects the collimated beam onto the secondary mirror which is mounted to the top of the tube. In turn, the secondary mirror reflects the beam onto the split photodiode. Any tube bending results in a change in the secondary mirror's relative angle causing the beam to translate over the split photodiode whose signals can then be differenced and amplified resulting in the desired position information.

In the second case, the primary mirror is mounted at the top of the lower half of the tube and the secondary mirror is mounted at the top of the upper half of the tube. In this way, the secondary mirror acts much like the fixed mirror of the first case but being attached to the tube, it captures the dynamics of the top half of the tube relative to its bottom half. Thus, all tube dynamics are captured with the reflection of the collimated beam off of each mirror in turn leading to its translation over the split photodiode. In both cases, the mirror angles are arbitrary so long as the collimated light source reflects off of one onto the other throughout the stroke of the motion. Also, the gain can be adjusted mechanically by increasing the distance between the split photodiode and secondary mirror (thereby increasing the optical lever length) and/or electronically. Preferably, at least two sensors are used. The second sensor being at a right angle to the first. For example, though not shown in FIGS. 10A and 10B, an additional sensor is set at a right angle to the sensor shown to achieve feedback in both x- and y- directions.

Figure 11:
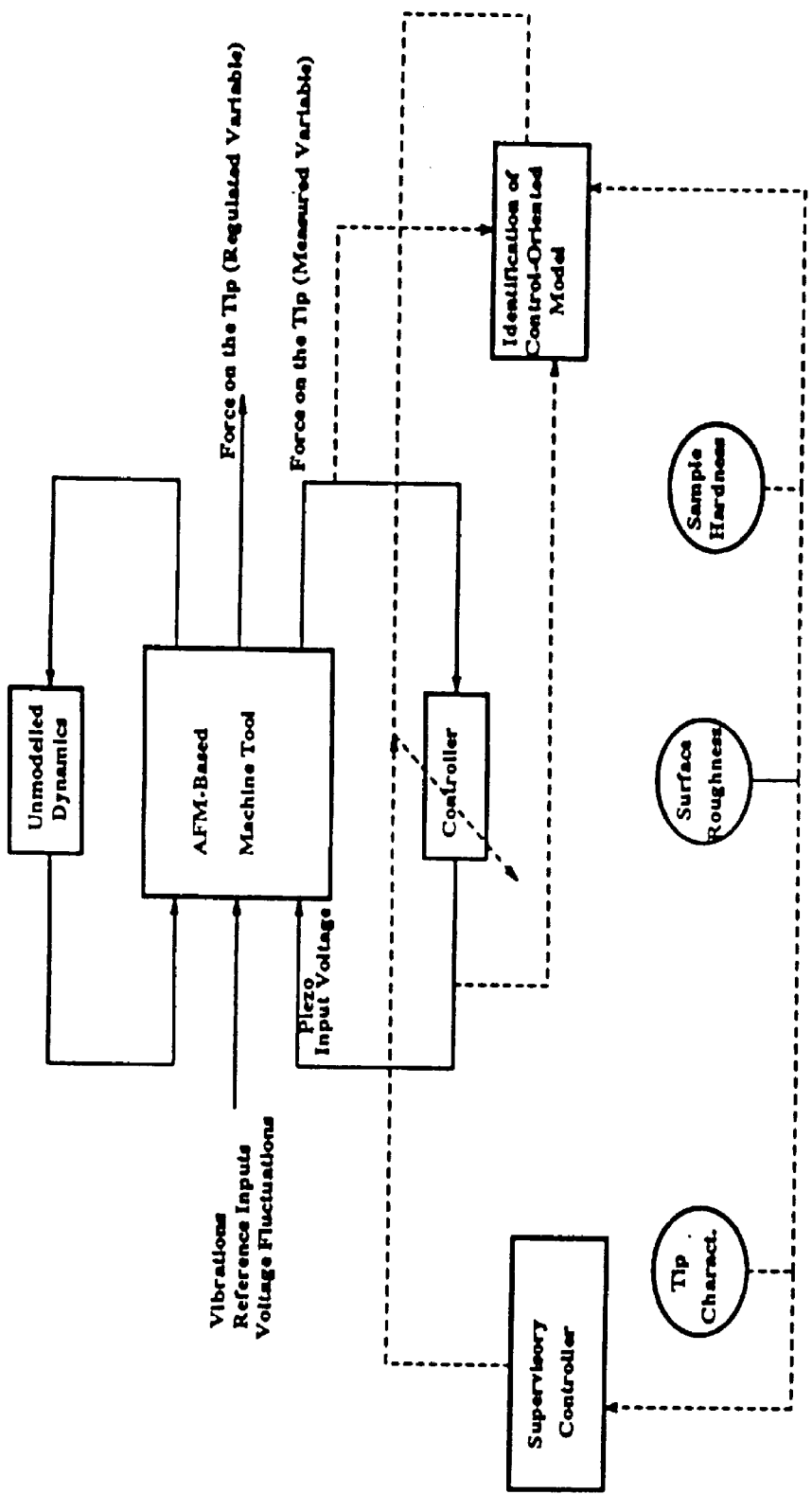
FIG. 11 is a block diagram for the controller system for controlling the force between the cantilever tip and the sample surface.
Figure 12:
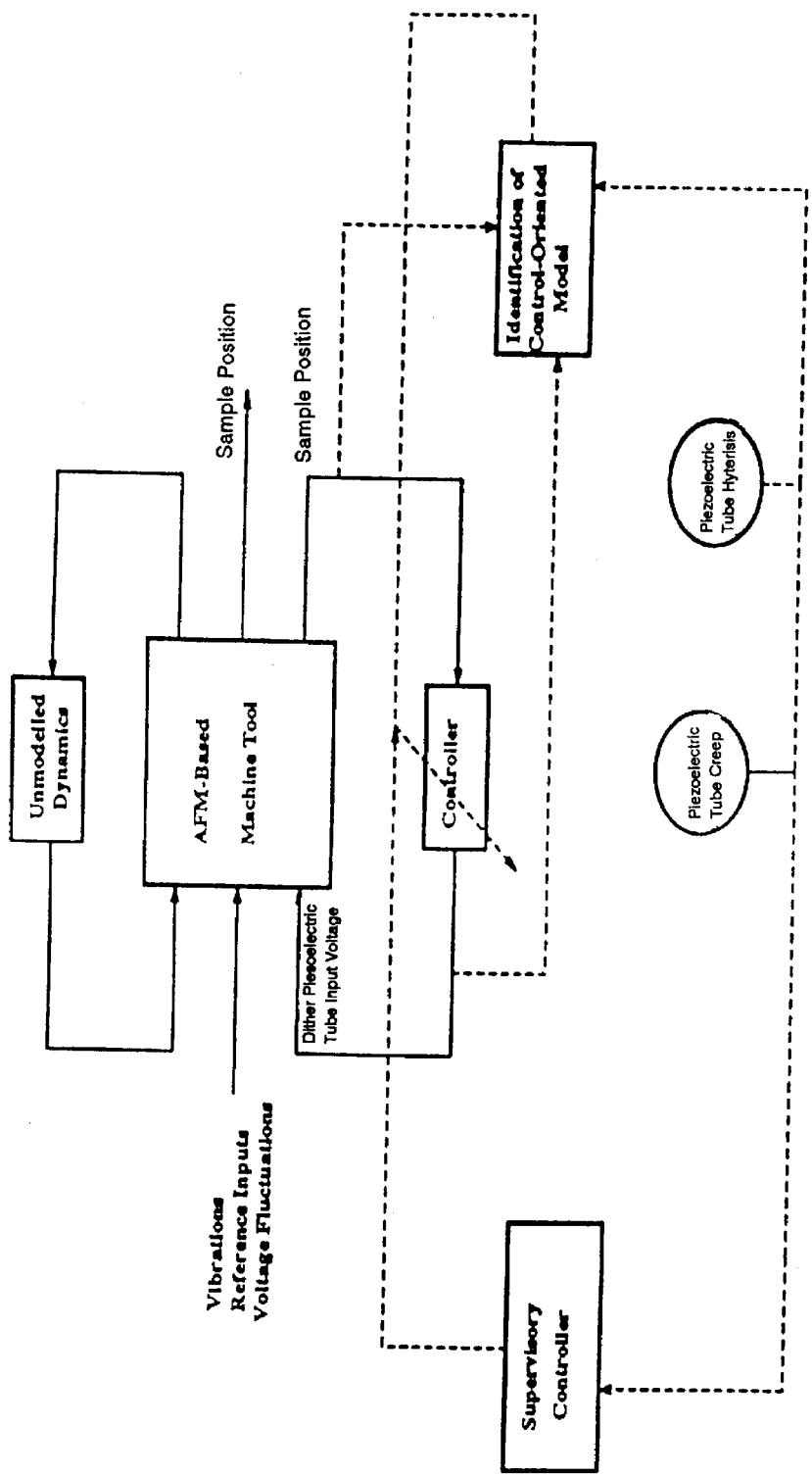
FIG. 12 is a block diagram for the controller system for the piezoelectric tube.

The sensor allows for a feedback control system for controlling the motion of the piezoelectric tube. An example of a feedback control system is shown in the block diagram of FIG. 12. FIG. 11 is a block diagram for the controller system for controlling the force between the cantilever tip and the sample surface, preferably in real time. Based on these block diagrams, one skilled in the art can construct such control systems using components known in the art. For example, the controller can be $1_1$ controller {Diaz-Bobillo, I., et al., *IEEE Trans. on Automatic Control*, 38(10):1459–1482 (1993)} or $H_{\infty}$ controller {Doyle, J., et al., *IEEE Trans. on Automatic Control*, 34(8):831–847 (1989)}. The supervisory controller can be a gain scheduling controller. Also within the scope of this invention are other control systems which one skilled in the art may arrive at based on the teaching of this application and what is known in the art.

Having described what the applicants believe their invention to be, the following example is presented to illustrate the invention, and are not to be construed as limiting the scope of the invention.

EXAMPLE

Figure 5A:
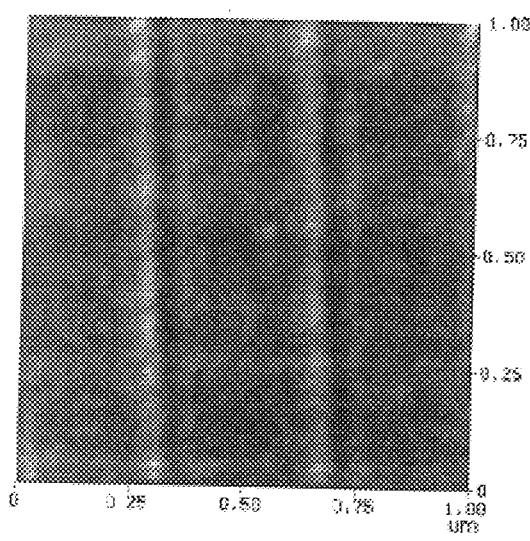
FIGS. 5A and 5B are AFM images of machining grooves in a silicon (Si) surface under loads (A) 9.4 μN and (B) 23.6 μN.
Figure 5B:
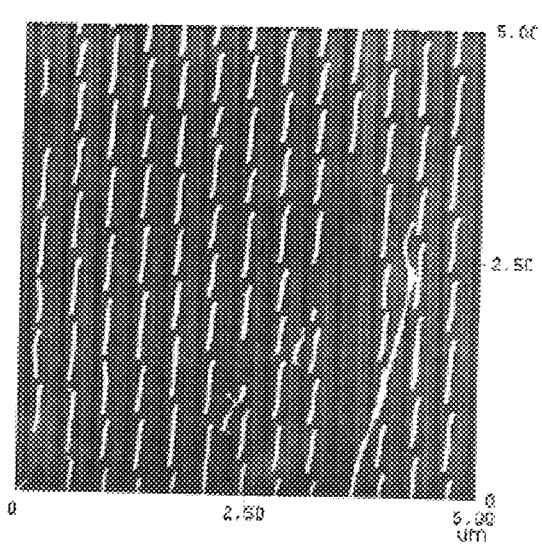
Figure 6:
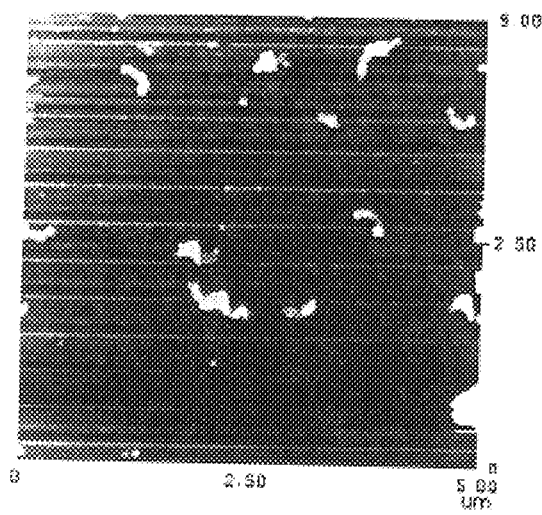
FIG. 6 is an AFM image of machining grooves under 42.5 μN load.

A commercially available AFM (Nanoscope III, Digital Instruments, Santa Barbara, Calif.) was modified as described above and made with a conical diamond tip sharpened (by Bruce Diamond Corporation) to produce a tip radius of about 0.1 $\mu$m. The modified AFM was used to machine grooves in Si(100). FIG. 5 shows images of machining grooves Si(100) surface under 9.4 $\mu$N (FIG. 5A) and 23.6 $\mu$N (FIG. 5B). Under 9.4 $\mu$N, the material was squeezed onto either side without wear particle production. At 23.6 $\mu$N long and slender particles were produced. FIG. 6 shows the grooves at 42.5 $\mu$N which produced short and round particles. It is clear that the mechanics is different in these three cutting regimes. The absence of cracks and sharp debris suggests that the Si behaved as a ductile material during cutting. A plot of the pressure versus depth-of-cut demonstrates that normal forces and pressures can be measured using the cutting tool.

Figure 7A:
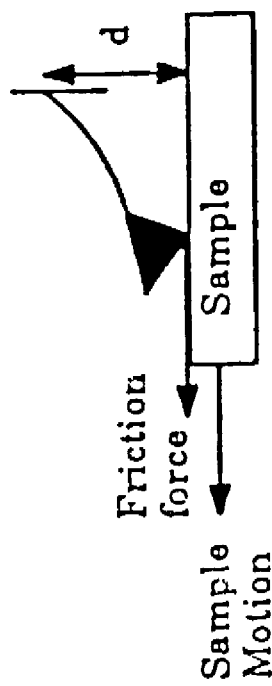
FIGS. 7A and 7B are schematic views of the cantilever probe showing the effect of friction on the bending moment of the cantilever probe.
Figure 7B:
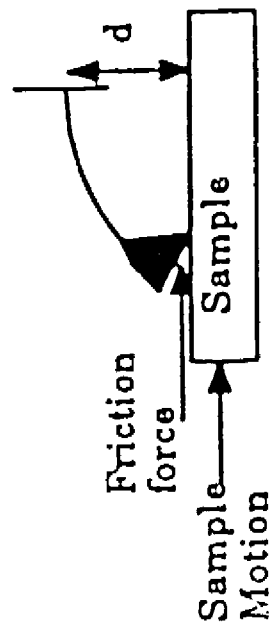

While machining was done under constant tip-sample force, tangential or frictional forces were measured with very high resolution, unlike with a conventional diamond turning machine. When the diamond tip was scanned to-and-fro, the frictional forces generated bending moments in opposite directions as shown in FIGS. 7A and 7B. This produced a differential signal in the split photodetector which was proportional to the frictional forces {Ruan, J. A., et al., *ASME J. of Tribology,* 116(2):378–388 (1994)}. The measurement of the frictional forces allowed the calculation of the energy required to remove a volume of material in Joules/m$^3$. In contrast with the traditional design of diamond turning machines, frictional and normal force measurements are natural outcomes of the flexible cantilever tool. Of interest is the fact that the minimum depth-of-cut, at 3 nm, corresponds to the thickness of the native oxide film. This is the first observation of a mechanical signature on such an ultra thin film during machining. It could be used to measure and study adhesion and properties of ultra thin coatings.

The foregoing is meant to illustrate, but not to limit, the scope of the invention. Within the scope of the present claims are other embodiments or modifications which one skilled in the art is capable of making, based on the teachings herein and what is known in the art, without undue experimentation.

All publications and patent applications mentioned in this Specification are herein incorporated by reference to the same extent as if each of them had been individually indicated to be incorporated by reference.

We claim:

1. A flexible tool capable of machining a sample at nanometer precision, comprising:
   (a) a cantilever;
   (b) means connected to said cantilever for machining the sample; and
   (c) means for varying the length of the cantilever whereby to control the stiffness of the cantilever to thereby control the depth-of-cut of the sample.

2. The flexible tool of claim 1, wherein the flexible tool is capable of maintaining a constant tool-to-sample distance or tool-to-sample force.

3. The flexible tool of claim 1, wherein the means for machining the sample comprises a tip which touches and machines the sample, wherein the means for controlling the depth-of-cut of the sample controls the length of the cantilever based on the tip-to-sample normal force, and the tip-to-sample frictional or tangential force.

4. The flexible tool of claim 3, wherein the means for controlling the depth-of-cut of the sample controls the motion of the tip in the z-direction.

5. The flexible tool of claim 4, wherein the means for controlling the depth-of-cut is based on a feedback control system.

6. The flexible tool of claim 5, further comprising means for providing rotational and/or translational relative motion between the tool and the sample.

7. The flexible tool of claim 4, wherein the flexible tool is an atomic force microscope modified to incorporate the means for controlling the depth-of-cut of the sample in the z-direction.

8. The flexible tool of claim 3, wherein the tip-to-sample normal force, the tip-to-sample frictional, and tangential force are simultaneously measured.

9. The flexible tool of claim 3, wherein the tip is capable of contacting and tapping the sample, whereby the flexible tool can machine the sample where the tip is contacting the sample and the flexible tool can image the sample when the tip is tapping the sample.

10. The flexible tool of claim 9, wherein oscillation of the cantilever, caused by the tip tapping the sample, can be used to obtain topographical images of the sample.

11. The flexible tool of claim 1, further comprising means for maintaining the sample in a parallel or substantially parallel position in relation to the means for machining the sample.

12. The flexible tool of claim 11, wherein the means for maintaining the sample in a parallel or substantially parallel position maintains the sample in a horizontal position and which means comprises a piezoelectric tube, wherein translational movement of a top of the piezoelectric tube, on which the sample is placed, in x- and y- planes occur without rotational movement about x- and y- axes thereof.

13. The flexible tool of claim 12, wherein orientation of the piezoelectric tube is detected by sensors placed on the piezoelectric tube.

14. The flexible tool of claim 13, wherein the flexible tool detects the forces between the flexible tool and the sample.

15. The flexible tool of claim 1, wherein the flexible tool is automated and the control in depth-of-cut of the sample is operated in real time.

16. The flexible tool of claim 15, wherein the tip is capable of contacting and tapping the sample, the flexible tool machines the sample where the tip is contacting the sample and the flexible tool images the sample where the tip is tapping the sample.

\* \* \* \* \*

UNITED STATES PATENT AND TRADEMARK OFFICE
CERTIFICATE OF CORRECTION

PATENT NO. : 5,831,181
DATED : November 3, 1998
INVENTOR(S) : Arun Majumdar, et al.

It is certified that error appears in the above-indentified patent and that said Letters Patent is hereby corrected as shown below:

| COLUMN | LINE | DESCRIPTION |
|---|---|---|
| 3 | 8 | Change "lines" to -- line -- |
| 6 | 34 | Change "mateial" to -- material -- |
|   |   | insert -- range --; and delete "to 10 N/m" |
| 10 | 40 | Change "$H_{oo}$" to -- $H_\infty$ -- |
| 12 | 11 | Change "the" to -- said -- |

Signed and Sealed this

Seventeenth Day of August, 1999

Attest:

Attesting Officer

Q. TODD DICKINSON

Acting Commissioner of Patents and Trademarks